United States Patent [19]

Kim

[11] 4,428,110
[45] Jan. 31, 1984

[54] METHOD OF MAKING AN ARRAY OF SERIES CONNECTED SOLAR CELLS ON A SINGLE SUBSTRATE

[75] Inventor: Jin K. Kim, Columbia, Md.

[73] Assignee: RCA Corporation, New York, N.Y.

[21] Appl. No.: 306,712

[22] Filed: Sep. 29, 1981

[51] Int. Cl.³ .......................................... H01L 31/18
[52] U.S. Cl. .................... 29/572; 29/577 C; 29/591; 136/249; 357/30
[58] Field of Search ............... 29/572, 577 R, 577 C, 29/587, 589, 590, 591; 136/244, 249 MS, 258 AM; 357/30

[56] References Cited

U.S. PATENT DOCUMENTS

| 4,042,418 | 8/1977 | Biter | 136/249 MS |
| 4,064,521 | 12/1977 | Carlson | 357/2 |
| 4,142,195 | 2/1979 | Carlson et al. | 357/15 |
| 4,162,505 | 7/1979 | Hanak | 357/30 |
| 4,163,677 | 8/1979 | Carlson et al. | 136/255 |
| 4,292,092 | 9/1981 | Hanak | 148/1.5 |

OTHER PUBLICATIONS

Biter, W. J. et al., "An Automatable Integrated Thin Film Solar Cell Array" in Conf. Record, 12th IEEE Photovoltaic Specialists Conf. 11–1976, pp.466–470.
"Properties of Amorphous Si—H and Si—F—H Films and its Photovoltaic Characteristics" by Y. Kuwano et al., *Extended Abstracts, The Electrochemical Society*, vol. 80-2, pp. 1421–1422.
"Amorphous Silicon Solar Cell and Integrated Cell Module" by Y. Kuwano, *JEE*, Nov. 1980, pp. 72–78.

*Primary Examiner*—L. Dewayne Rutledge
*Assistant Examiner*—Alan E. Schiavelli
*Attorney, Agent, or Firm*—Birgit E. Morris; Donald S. Cohen; William J. Burke

[57] ABSTRACT

A method of making a series connected array of amorphous silicon solar cells on a single substrate includes forming a plurality of spaced conductive lower electrodes on the substrate. Metal electrode stripes are applied on each of the lower electrodes. A layer of amorphous silicon is formed over the lower electrodes, metal electrode stripes and any exposed portions of the surface of the substrate. A plurality of spaced upper conductive electrodes are formed over the amorphous silicon layer with each of the upper electrodes having a portion overlying the electrode stripe on the lower electrode of an adjacent cell. The array is heated to spike the electrode stripes completely through the amorphous silicon layer to contact the overlying upper electrode and thereby electrically connect the cells in series.

6 Claims, 4 Drawing Figures

METHOD OF MAKING AN ARRAY OF SERIES CONNECTED SOLAR CELLS ON A SINGLE SUBSTRATE

BACKGROUND OF THE INVENTION

The present invention relates to solar cells. It has particular application to series connected amorphous silicon solar cells which are formed on a single substrate.

In order to convert solar energy into electrical energy, solar cells are used. Solar cells may be formed of various semiconductor materials, such as amorphous silicon. In order for solar cells to become available for general use, it is necessary that the formation of solar cells into arrays, comprising a plurality of cells, be made possible at a relatively low cost to the consuming public. As a typical amorphous silicon solar cell produces approximately one volt of electricity when exposed to the sun, such cells have to be connected in series in order to build up their voltages in order that their outputs may be used either directly, or transferred into storage devices, such as batteries, for indirect use. The process of connecting solar cells in series can be a labor intensive one. Accordingly, such a process would ordinarily be very expensive to perform.

SUMMARY OF THE INVENTION

The present invention provides an automatic method of producing series connected solar cells, such as amorphous silicon solar cells. The cells are produced as series connected arrays as a consequence of the manufacturing method. Such arrays may be produced to have any desired output voltage without requiring labor intensive operations.

In accordance with the present invention, a solar cell array comprises a plurality of adjacent, series connected solar cells on a single insulating substrate wherein adjacent cells are connected together by spiking a metal inter-electrode connection from the electrode below one cell through the amorphous silicon layer to the electrode on top of the next adjacent cell.

DETAILED DESCRIPTION OF AN EXEMPLARY EMBODIMENT

Figure 1:
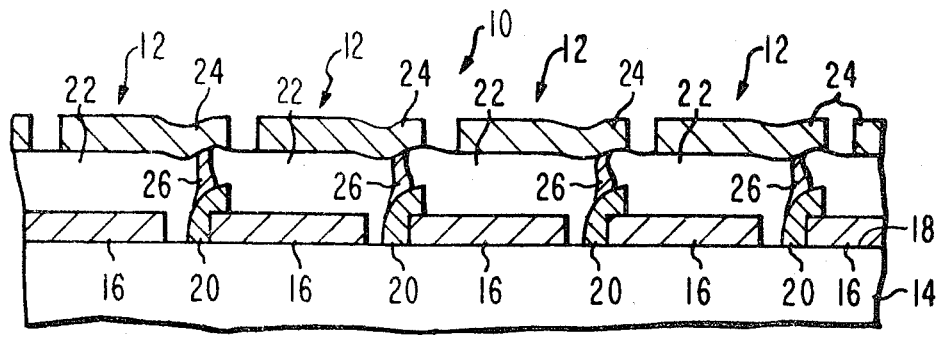
FIG. 1 illustrates a first embodiment of a solar cell of the type manufactured in accordance with the present invention.

Referring now to FIG. 1, a solar array 10 comprised of a plurality of solar cells 12, is shown. Solar cells 12 are formed on a substrate 14 which is comprised either of glass or of some other, similar transparent material. A series of transparent, conductive electrodes 16 comprised of indium tin oxide (ITO) are used in the preferred embodiment of the invention, although any other suitable transparent, conductive material could be used. The electrodes 16 are on a surface 18 of the glass substrate 14. A series of metal electrodes 20, which are comprised of a metal, such as aluminum, copper, or gold, overlie one edge of each of the ITO electrodes 16. The metal electrodes 20 may also overlie a portion of the surface 18 of the glass substrate 14, although this is not necessary for the proper operation of the invention. Semiconductor portions 22 of the cells 12 overlie the ITO and metal electrodes 16, 20 on the glass substrate 14. In the preferred embodiment of the invention, the semiconductor portions 22 are comprised of a layer of amorphous silicon. On the surface of the semiconductor portions 22 there are a series of conductive, metal electrodes 24 which are comprised of titanium and aluminum in the preferred embodiment of the invention.

The solar array 10 further comprises a series of inter-electrode connections 26 between the electrodes 24 on the top surface of the amorphous silicon layer 22 and the electrodes 20 on each of the ITO electrodes 16. The method of forming the connections 26 will be described hereinafter.

As can be seen, there is an electrical series connection which exists between each of the ITO electrodes 16, the metal electrodes 20, and the top metal electrodes 24, with the connection between the metal electrodes 20 and the top metal electrodes 24 being formed by the inter-electrode connections 26. Thus, each of the ITO electrodes 16, at the bottom of each of the cell 12, makes electrical contact to the top electrode 24 of the next adjacent cell 12 to the left of the cell 12 under which the ITO electrode 16 lies. It should be noted, however, that the amorphous silicon portions 22 must have a low conductivity in order that the connection made by the amorphous silicon portions 22 between the ITO electrodes 16 can be ignored.

The amorphous silicon portions 22 of each cell 12 are connected in series such that the bottom of each amorphous silicon portion 22 makes electrical contact to the top of the adjacent amorphous silicon portion to its left as viewed in FIG. 1, and the number of series connected cells 12 in a particular array is determined by the voltage requirements for a particular application.

Figure 2:
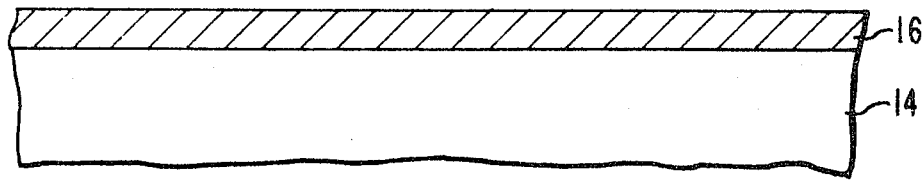
FIGS. 2–4 illustrate the method of manufacturing the solar cell of FIG. 1.
Figure 3:
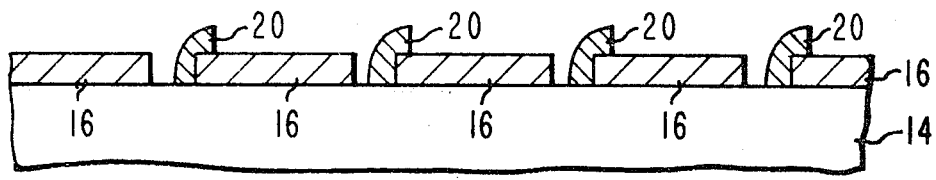
Figure 4:
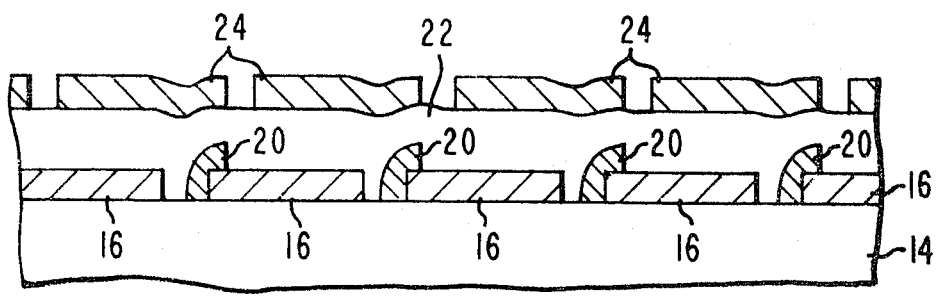

Referring now to FIGS. 2–4, the method of manufacturing series connected cells 12 of FIG. 1 will be explained. With reference to FIG. 2, one starts with the substrate 14, such as a glass substrate, upon which a transparent, conductive layer 16, which is comprised of indium tin oxide (ITO) in the preferred embodiment of the invention, is applied. The transparent, conductive layer 16 may be applied by any desired technique. Following the deposition of the conductive layer 16 on the substrate 14, the layer 16 is scribed in order to make it discontinuous as shown in FIG. 3. The scribing of the layer 16 can be accomplished by any means, such as by laser scribing. Following the scribing of the layer 16, a series of metal electrodes 20 are deposited on the surface of the scribed layer 16. The metal electrodes 20, which are typically comprised of a metal such as aluminum, copper or gold, may be deposited through a mask in order to obtain the pattern shown in cross-section FIG. 3. As shown, it is only important that the metal electrodes 20 overlie at least a portion of each of the ITO electrodes 16. They may extend over the edges of the ITO electrodes 16 into the scribe areas between the ITO electrodes 16 so long as they do not short out two adjacent ITO electrodes 16.

Following the deposition of the metal electrodes 20, an amorphous silicon layer 22 is deposited on the surface of the ITO and metal electrodes 16, 20. As is well known in the art, the amorphous silicon layer 22 will typically comprise a three-part structure having P, I, and N type semiconductor material. However, in the present invention, the amorphous silicon layer 22 may have only I and N type semiconductor material and a Schottky barrier. In view of the fact that either the P type material or the N type material can be on the surface of the amorphous silicon layer 22 which is exposed to incident radiation, for the purpose of describing the present invention, the amorphous silicon layer 22 will simply be referred to as a layer. However, those of ordinary skill in the art will recognize that the manner of manufacturing the structures known in the art are well known and more fully described in U.S. Pat. No. 4,064,521 entitled Semiconductor Device Having a Body of Amorphous Silicon which issued on Dec. 20, 1977 to D. E. Carlson; U.S. Pat. No. 4,142,195 entitled Schottky Barrier Semiconductor Device and Method of Making Same which issued on Feb. 27, 1979 to D. E. Carlson et al.; U.S. Pat. No. 4,162,505 entitled Inverted Amorphous Silicon Solar Cell Utilizing Cermet Layers which issued on July 24, 1979 to J. J. Hanak; and U.S. Pat. No. 4,163,677 entitled Schottky Barrier Amorphous Silicon Solar Cell with Thin Doped Region Adjacent Metal Schottky Barrier which issued on Aug. 7, 1979 to D. E. Carlson et al. Each of the foregoing U.S. patents are incorporated herein by reference for the purpose of explaining the manner in which the amorphous silicon layer 22 can be manufactured and for the purpose of describing the composition of the amorphous silicon layer 22.

With continued reference to FIG. 3, conductive metal stripes 24 are applied over the surface of the amorphous silicon layer 22 by any convenient technique. Thus, the metal stripes 24 may be evaporated onto the surface of the amorphous silicon layer 22 through a mask. Alternatively, the stripes 24 can be formed using a photolithographic method of the type commonly known in the art or by a "paint and peel" method wherein stripes are painted, a metal layer is applied, and the painted stripes are removed thereby leaving metal between the paint stripes. The metal stripes 24 are comprised of a metal, such as aluminum or tin.

Alternatively, the conductive stripes 24 would be comprised of a material selected so that it is transparent to incident radiation if the upper surface of the amorphous silicon layer 22 is to receive light. Accordingly, a material such as ITO is typically used for the stripes 24 if incident radiation is to be from above. Following the application of the conductive stripes 24, the structure is again subjected to a scribing process, such as a laser scribing, in order to cut through the conductive layer 24 thereby making it discontinuous, as shown in FIG. 4.

In view of the fact that the device is subjected to various processes in which it is heated subsequent to the application of the metal stripes 20, spikes 26 are generated through the amorphous silicon layer 22 to electrically connect the upper layers 24 with the underlying metal electrodes 16, as shown in FIG. 1. Accordingly, following the described manufacturing procedure, the device 10, as shown in FIG. 1, will be completed, and there will be a series connection between the amorphous silicon solar cells 12.

I claim:
1. In a method of forming an array of series connected solar cells which includes;
   (a) forming a series of conductive lower electrodes on an insulating substrate;
   (b) forming a semiconductor layer on the surface of said conductive lower electrodes and said substrate; and
   (c) applying a series of conductive upper electrodes over the surface of said semiconductor layer;
   the improvement comprising forming an electrical connection between the upper electrode of one cell and the lower electrode for the next adjacent cell by spiking an inter-electrode connection completely through the semiconductor layer, said spiked inter-electrode connection resulting from the spiking of metal stripes applied over said lower electrodes.

2. The method of claim 1 wherein said step of spiking comprises heating a series of metal stripes on the surface of said lower electrodes to cause them to spike through said semiconductor layer.

3. The method of claim 2 wherein said step of forming a series of conductive lower electrodes comprises forming a single conductive layer and then scribing it to make it electrically discontinuous.

4. The method of claim 2 wherein said step of forming a series of conductive upper electrodes comprises forming a single conductive layer and then scribing it to make it electrically discontinuous.

5. The method of either claim 3 or claim 4 wherein said scribing step is accomplished by laser scribing.

6. The method of claim 1 wherein the semiconductor layer is of amorphous silicon.

* * * * *